(12) United States Patent
Mangold

(10) Patent No.: US 12,482,762 B2
(45) Date of Patent: Nov. 25, 2025

(54) HEAT SINKING BY THRU-MOLD VIAS IN SHIELDED MODULES

(71) Applicant: Qorvo US, Inc., Greensboro, NC (US)

(72) Inventor: Tobias Mangold, Huglfing (DE)

(73) Assignee: Qorvo US, Inc., Greensboro, NC (US)

( * ) Notice: Subject to any disclaimer, the term of this patent is extended or adjusted under 35 U.S.C. 154(b) by 485 days.

(21) Appl. No.: 17/985,101

(22) Filed: Nov. 10, 2022

(65) Prior Publication Data

US 2023/0144055 A1 May 11, 2023

Related U.S. Application Data

(60) Provisional application No. 63/278,476, filed on Nov. 11, 2021.

(51) Int. Cl.
*H01L 23/552* (2006.01)
*H01L 23/538* (2006.01)
*H01L 23/00* (2006.01)

(52) U.S. Cl.
CPC ........ *H01L 23/552* (2013.01); *H01L 23/5384* (2013.01); *H01L 24/32* (2013.01); *H01L 2224/32227* (2013.01); *H01L 2924/18161* (2013.01)

(58) Field of Classification Search
CPC ... H01L 23/552; H01L 23/5384; H01L 24/32; H01L 2224/32227; H01L 2924/18161
See application file for complete search history.

(56) References Cited

U.S. PATENT DOCUMENTS

| | | | |
|---|---|---|---|
| 2008/0019112 A1* | 1/2008 | Hatanaka | H01L 24/97 257/E23.125 |
| 2012/0171814 A1* | 7/2012 | Choi | H01L 23/367 257/E21.504 |
| 2018/0090475 A1* | 3/2018 | Zuo | H01L 23/552 |
| 2022/0173082 A1* | 6/2022 | Kim | H01L 23/5389 |

OTHER PUBLICATIONS

Chong, D. et al., "Exposed Die-Top Encapsulation Molding for an Improved High-Performance Flip Chip BGA Package," IEEE Transactions on Advanced Packaging, vol. 29, Issue 4, Nov. 2006, IEEE, 9 pages.

* cited by examiner

*Primary Examiner* — Peniel M Gumedzoe
(74) *Attorney, Agent, or Firm* — Withrow & Terranova, P.L.L.C.

(57) ABSTRACT

The present disclosure relates to a module package with a shielded module and a process for making the same. The disclosed shielded module includes a module board, at least one flip-chip die attached to the module board, a mold compound with at least one via hole, and a shielding structure. The mold compound resides over the module board to partially encapsulate the at least one flip-chip die, where the at least one via hole extends vertically from a top surface of the mold compound to a top surface of the at least one flip-chip die. The shielding structure completely covers surfaces within the at least one via hole and extends over the top surface and side surfaces of the mold compound. Herein, the shielding structure is conductive and in contact with the top surface of the at least one flip-chip die.

18 Claims, 11 Drawing Sheets

HEAT SINKING BY THRU-MOLD VIAS IN SHIELDED MODULES

RELATED APPLICATIONS

This application claims the benefit of provisional patent application Ser. No. 63/278,476, filed Nov. 11, 2021, the disclosure of which is hereby incorporated herein by reference in its entirety.

FIELD OF THE DISCLOSURE

The present disclosure relates to a shielded module in a module package and a process for making the same, and more particularly to a shielded module with enhanced heat dissipation, which utilizes thru-mold vias formed by electromagnetic shielding, and a process to provide the thru-mold vias for the shielded module.

BACKGROUND

With the current popularity of portable communication devices and developed semiconductor fabrication technology, high speed and high-performance components (e.g., transistors, resonators, and etc.) are more densely integrated on semiconductor dies. Consequently, the amount of heat generated by the semiconductor dies will increase significantly due to the large number of components integrated on the semiconductor dies, the large number of dies in modules and increased radio frequency (RF) path losses due to enhanced in-module complexity, the large amount of power passing through the components, and the high operation speed of the components. Accordingly, it is desirable to providing a low impedance thermal path from the semiconductor dies to an external heat sink for better heat dissipation.

Flip chip assembly technology is widely utilized in semiconductor packaging due to its preferable solder interconnection between flip chip dies and laminate, which eliminates the space needed for wire bonding and die surface area of a package and essentially reduces the overall size of the package. In addition, the elimination of wire connections and implementation of a shorter electrical path from the flip chip die to the laminate reduces undesired inductance and capacitance.

However, in flip-chip assembly, bottom side inputs/outputs (I/Os) reduce the cross-section available for heat transfer from the flip chip dies towards the laminate and a background heat sink, respectively. In addition, mold compounds, which are typically used to encapsulate and underfill flip-chip dies to protect the dies against damage from the outside environment, are formulated from epoxy resins containing silica particulates. The epoxy mold compound is low-cost and easy to apply, but has a poor thermal conductivity, which limits heat dissipation from the semiconductor dies.

On the other hand, stringent constrains in cost, complexity, and size limit the usage of dedicated heat sinking elements for the semiconductor dies in typical RF applications (e.g., RF modules with bulk acoustic wave RF filters for mobile communication).

To accommodate the increased heat generation of high performance dies and to utilize the advantages of flip chip assembly with low-cost epoxy mold compound, it is therefore an object of the present disclosure to provide an improved module/package design in a configuration for better heat dissipation without increasing the size, cost, and complexity of the final product.

SUMMARY

The present disclosure relates to a module package with a shielded module and a process for making the same. The disclosed shielded module includes a shielding structure and a molded module that has a module board, at least one flip-chip die, and a mold compound with at least one via hole. The at least one flip-chip die is attached to a top surface of the module board. The mold compound resides over the top surface of the module board to fully encapsulate sides of the at least one flip-chip die and partially encapsulate a top surface of the at least one flip-chip die, where a top surface of the mold compound is vertically beyond the top surface of the at least one flip-chip die.

The at least one via hole within the mold compound is vertically above the at least one flip-chip die and extends vertically from the top surface of the mold compound to the top surface of the at least one flip-chip die, such that a portion of the top surface of the at least one flip-chip die is not covered by the mold compound. Herein, a top surface of the molded module is the top surface of the mold compound, a bottom surface of the molded module is a bottom surface of the module board, and a side surface of the molded module is a combination of a side surface of the mold compound and a side surface of the module board. The shielding structure completely covers surfaces within the at least one via hole, completely covers the top surface of the molded module, at least partially covers the side surface of the molded module, and does not cover the bottom surface of the molded module. In addition, the shielding structure is conductive and in contact with the top surface of the at least one flip-chip die. Portions of the shielding structure within the at least one via hole form at least one thru-mold via.

In one embodiment of the shielded module, the at least one via hole includes a number of via holes distributed over the at least one flip-chip die. Each via hole extends vertically from the top surface of the mold compound to the top surface of the at least one flip-chip die, such that multiple portions of the top surface of the at least one flip-chip die are not covered by the mold compound. The shielding structure completely covers surfaces within each via hole, such that the shielding structure is in contact with the top surface of the at least one flip-chip die at a bottom of each via hole.

In one embodiment of the shielded module, the at least one via hole is a center via hole which is located over a center of the at least one flip-chip die.

In one embodiment of the shielded module, the at least one flip-chip die includes a device layer, a number of die interconnections extending from a bottom surface of the device layer to the top surface of the module board, and a die substrate over a top surface of the device layer, such that a backside of the die substrate is the top surface of the at least one flip-chip die. The mold compound fills gaps among the die interconnections to encapsulate the bottom surface of the device layer and sides of each die interconnection.

In one embodiment of the shielded module, a thermal conductivity of the die substrate is higher than a thermal conductivity of the mold compound.

In one embodiment of the shielded module, the die substrate is formed of silicon.

According to one embodiment, the shielded module further includes a via filler. The via filler fills the at least one via hole that remains within the at least one thru-mold via.

In one embodiment of the shielded module, the shielding structure includes a first layer formed of copper, aluminum, silver, or gold, and a second layer formed of nickel. Herein, the first layer completely covers the surfaces within the at least one via hole, completely covers the top surface of the molded module, at least partially covers the side surface of the molded module, and does not cover the bottom surface of the molded module, while the second layer is formed over the first layer.

In one embodiment of the shielded module, the shielding structure has a certain thickness, such that a thermal conductivity of the at least one thru-mold via is higher than a thermal conductivity of the mold compound.

In one embodiment of the shielded module, the shielding structure further includes a seed layer, which directly and completely covers the surfaces within the at least one via hole, completely covers the top surface of the molded module, at least partially covers the side surface of the molded module, and does not cover the bottom surface of the molded module, such that the seed layer is in contact with the top surface of the at least one flip-chip die. The seed layer is formed of copper, aluminum, silver, or gold. The first layer is formed over the seed layer.

In one embodiment of the shielded module, the mold compound is formed of an organic epoxy resin system.

In one embodiment of the shielded module, the at least one flip-chip die includes a number of flip-chip dies, each of which is attached to the top surface of the module board. The mold compound resides over the top surface of the module board to fully encapsulate sides of each flip-chip die and partially encapsulate a top surface of each flip-chip die. The top surface of the mold compound is vertically beyond the top surface of each flip-chip die. The at least one via hole includes a number of via holes, and at least one of the via holes is vertically above each flip-chip die. Each via hole extends vertically from the top surface of the mold compound to the top surface of a corresponding flip-chip die, such that a portion of the top surface of each flip-chip die is not covered by the mold compound. The shielding structure completely covers surfaces within each via hole, such that the shielding structure is in contact with the top surface of each flip-chip die. Portions of the shielding structure within each via hole form a number of thru-mold vias.

In one embodiment of the shielded module, each flip-chip die is a bulk acoustic wave (BAW) filter die.

In one embodiment of the shielded module, multiple ones of the via holes are vertically above each flip-chip die.

In one embodiment of the shielded module, only one of the via holes is vertically above each flip-chip die.

In one embodiment of the shielded module, each flip-chip die includes a device layer, a number of die interconnections extending from a bottom surface of the device layer to the top surface of the module board, and a die substrate over a top surface of the device layer, such that a backside of the die substrate is the top surface of each flip-chip die. The mold compound fills gaps among the die interconnections to encapsulate the bottom surface of the device layer and sides of each die interconnection.

According to an exemplary process, a molded precursor, which includes a module board, at least one flip-chip die, and a mold compound, is first provided. Within the molded precursor, the at least one flip-chip die is attached to a top surface of the module board, and the mold compound resides over the top surface of the module board to fully encapsulate the at least one flip-chip die. Next, at least one via hole is formed within the mold compound to complete a molded module. Herein, the at least one via hole is vertically above the at least one flip-chip die and extends vertically from a top surface of the mold compound to a top surface of the at least one flip-chip die, such that a portion of the top surface of the at least one flip-chip die is not covered by the mold compound. A top surface of the molded module is the top surface of the mold compound, a bottom surface of the molded module is a bottom surface of the module board, and a side surface of the molded module is a combination of a side surface of the mold compound and a side surface of the module board. A shielding structure is then formed over the molded module. The shielding structure completely covers surfaces within the at least one via hole, completely covers the top surface of the molded module, completely covers the side surface of the molded module, and does not cover the bottom surface of the molded module. In addition, the shielding structure is conductive and is in contact with the top surface of the at least one flip-chip die.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1A:
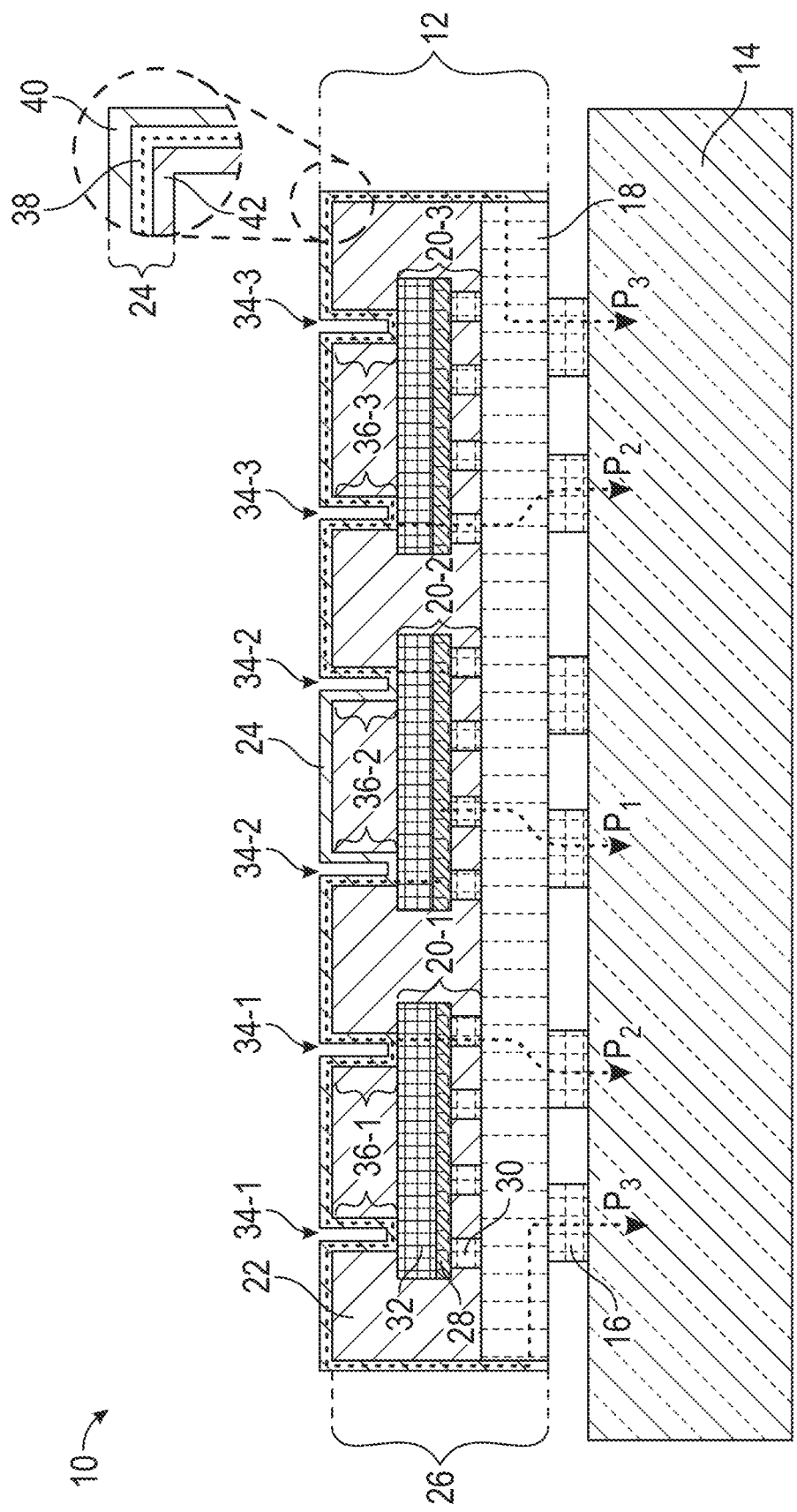
FIGS. 1A-1B illustrate an exemplary module package with a thermal-enhanced shielded module according to some embodiments of the present disclosure.

It will be understood that for clear illustrations, FIGS. 1A-5F may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to a module package with a thermal-enhanced shielded module and a process for making the same. FIG. 1A illustrates an exemplary module package 10 according to some embodiments of the present disclosure. The module package 10 includes a shielded module 12, a carrier board 14 underneath the shielded module 12, and a number of module interconnections 16 (only one module interconnection is labeled with a reference number for clarity) extending from a bottom surface of the shield module 12 to a top surface of the carrier board 14. The carrier board 14 may be a laminate, such as a printed circuit board (PCB), an evaluation board, or a photo board, and functions as an external heat sink for the shielded module 12. Each module interconnection 16 may be a copper pillar or a solder ball bump, and is eligible for transmitting electrical signals and/or heat from the shield module 12 to the carrier board 14. In some applications, the module interconnections 16 might be omitted. The shield module 12 is electrically and thermally coupled to the carrier board 14 via a conductive glue.

For the purpose of this illustration, the shielded module 12 includes a module board 18, three flip-chip dies 20 (i.e., a first flip-chip die 20-1, a second flip-chip die 20-2, and a third flip-chip die 20-3), a mold compound 22, and a shielding structure 24. The three flip-chip dies 20 are heat generating elements in the shielded module 12. Herein, the module board 18, the flip-chip dies 20, and the mold compound 22 compose a molded module 26 without shielding. In different applications, the shielded module 12/the molded module 26 may include fewer or more flip-chip dies, and may further include one or more wire-bond assembled dies, and/or one or more embedded components, like land grid arrays (LGAs), surface-mounted devices (SMDs) (not shown). If there are one or more wire-bond assembled dies included in the shielded module 12, the shielding structure 24 may not be in contact with the wire-bond assembled dies.

In detail, the module board 18 may be a laminate (e.g., PCB) with multiple metal conducting layers (not shown for simplification and clarity) for signal and heat transmission. The flip-chip dies 20 are formed on a top surface of the module board 18. For a non-limited example, the first flip-chip die 20-1 and the third flip-chip die laterally surround the second flip-chip die 20-1. Each flip-chip die 20 may be an active device, such as a bulk acoustic wave (BAW) filter die, which has an operating (active) state and a non-operating (passive) state. In some applications, there might be one or more purely passive flip-chip dies (not shown) and/or other passive components, like SMDs (not shown) formed on the top surface of the module board 18. Herein, each flip-chip die 20 includes a device layer 28, a number of die interconnections 30 underneath the device layer 28, and a die substrate 32 over the device layer 28 (only one device layer, one die interconnection, and one die substrate are labeled with reference numbers for clarity). As such a top surface of a corresponding flip-chip die 20 is a backside of each die substrate 32. In different applications, one flip-chip die 20 may include a metal layer over the die substrate 32 (not shown). As such, the top surface of the flip-chip die 20 is a top surface of the metal layer but not the backside of the die substrate 32. The flip-chip dies 20 may have a same or different height.

Each device layer 28 is configured to provide functionalities (e.g., BAW filtering) of a corresponding flip-chip die 20 and generates most of the heat in the corresponding flip-chip die 20. Each die interconnection 30 may be a copper pillar or a solder ball bump, and extends from a bottom surface of the device layer 28 to the top surface of the module board 18. As such, each die interconnection 30 is eligible for transmitting electrical signals and/or the heat from a corresponding device layer 28 to the module board 18. Each die substrate 32 may be formed of silicon or other semiconductor materials, which has a higher thermal conductivity than the mold compound 22 (more details are described in the following paragraphs). For a non-limited example, the die substrate 32 may have a relatively good thermal conductivity higher than 5 W/mK, such that the heat generated by the device layer 28 can be transmitted to the top surface of the flip-chip die 20 through the die substrate 32. If the die substrate 32 over the device layer 28 has a low thermal conductivity, the die substrate 32 will block the heat flux from flowing vertically upward.

The mold compound 22 resides over the top surface of the module board 18 to substantially encapsulate each flip-chip die 20. Regardless of the same or different height of the flip-chip dies 20, a top surface of the mold compound 22 is vertically beyond the top surface of each flip-chip die 20 (i.e., vertically beyond the backside of the die substrate 32 of each flip-chip die 20). Herein, the mold compound 22 includes a number of via holes 34, each of which is vertically above a corresponding flip-chip die 20 and extends vertically from the top surface of the mold compound 22 to the top surface of a corresponding flip-chip die 20 (i.e., to the backside of the die substrate 32 of the corresponding flip-chip die 20). In a non-limited example, multiple first via holes 34-1 are distributed over the first flip-chip die 20-1, each of which extends vertically from the top surface of the mold compound 22 to the top surface of the first flip-chip die 20-1. Multiple second via holes 34-2 are distributed over the second flip-chip die 20-2, each of which extends vertically from the top surface of the mold compound 22 to the top surface of the second flip-chip die 20-2. Multiple third via holes 34-3 are distributed over the third flip-chip die 20-3, each of which extends vertically from the top surface of the mold compound 22 to the top surface of the third flip-chip die 20-3. As such, small portions of the backside of the die substrate 32 of each flip-chip die 20 are not covered by the mold compound 22. Except for these backside portions, each flip-chip die 20 is fully encapsulated by the mold compound 22 (i.e., the mold compound 22 encapsulates sides of each flip-chip die 20 and optionally fills gaps among the die interconnections 30 to encapsulate the bottom surface of the device layer 28 and sides of each die interconnection 30).

Notice that, in some applications, not every flip-chip die 20 has corresponding via holes 34. In other words, the via holes 34 may be formed vertically only above certain ones of the flip-chip dies 20 rather than each flip-chip die 20. In a non-limited example, the second via holes 34-2 are vertically above the top surface of the (high power/hot) second flip-chip die 20-2 and the third via holes 34-3 are vertically above the top surface of the (high power/hot) third flip-chip die 20-3, while the first via holes 34-1 are omitted and the first flip-chip die 20-1 is fully encapsulated by the mold compound 22 (not shown). In addition, if wire-bond assembled dies, SMDs, and/or passive flip-chip dies are included in the shielded module 12, the mold compound 22 will completely encapsulate these components (not shown).

A horizontal cross-section of each via hole 34 might be a circular, square, oval, triangular, rectangular, or any proper shape for forming the shielding structure 24 inside. In addition, each via hole 34 needs to be large enough for plating the shielding structure 24.

Due to cost constraints and compatibility to conventional molding technology, the mold compound 22 is typically formed of a standard molding material, such as an organic epoxy resin system. Although the organic epoxy resin system is low-cost and easy to apply, the organic epoxy resin system has a poor thermal conductivity. Since the mold compound 22 substantially encapsulates each flip-chip die 20, the poor thermal conductivity material (e.g., organic epoxy resin system) used to form the mold compound 22 limits heat dissipation from the flip-chip dies 20 through the mold compound 22 (more details are described below). Alternative mold compounds with high thermal conductivities are either not compatible with the utilized compression molding technology or very expensive.

Herein, the top surface of the mold compound 22 is a top surface of the molded module 26, a bottom surface of the module board 18 is a bottom surface of the molded module 26, and a combination of a side surface of the mold compound 22 and a side surface of the module board 18 is a side surface of the molded module 26. In this illustration, the shielding structure 24 completely covers the top surface and the side surface of the molded module 26 and does not cover the bottom surface of the molded module 26. In different applications, the shielding structure 24 may only partially (e.g., 90%) cover the side surface of the molded module 26 (e.g., completely covers the side surface of the mold compound 22, but partially or not covers the side surface of the module board 18). Herein and hereafter, completely covering a surface refers to covering at least 95% of the surface.

Figure 2:
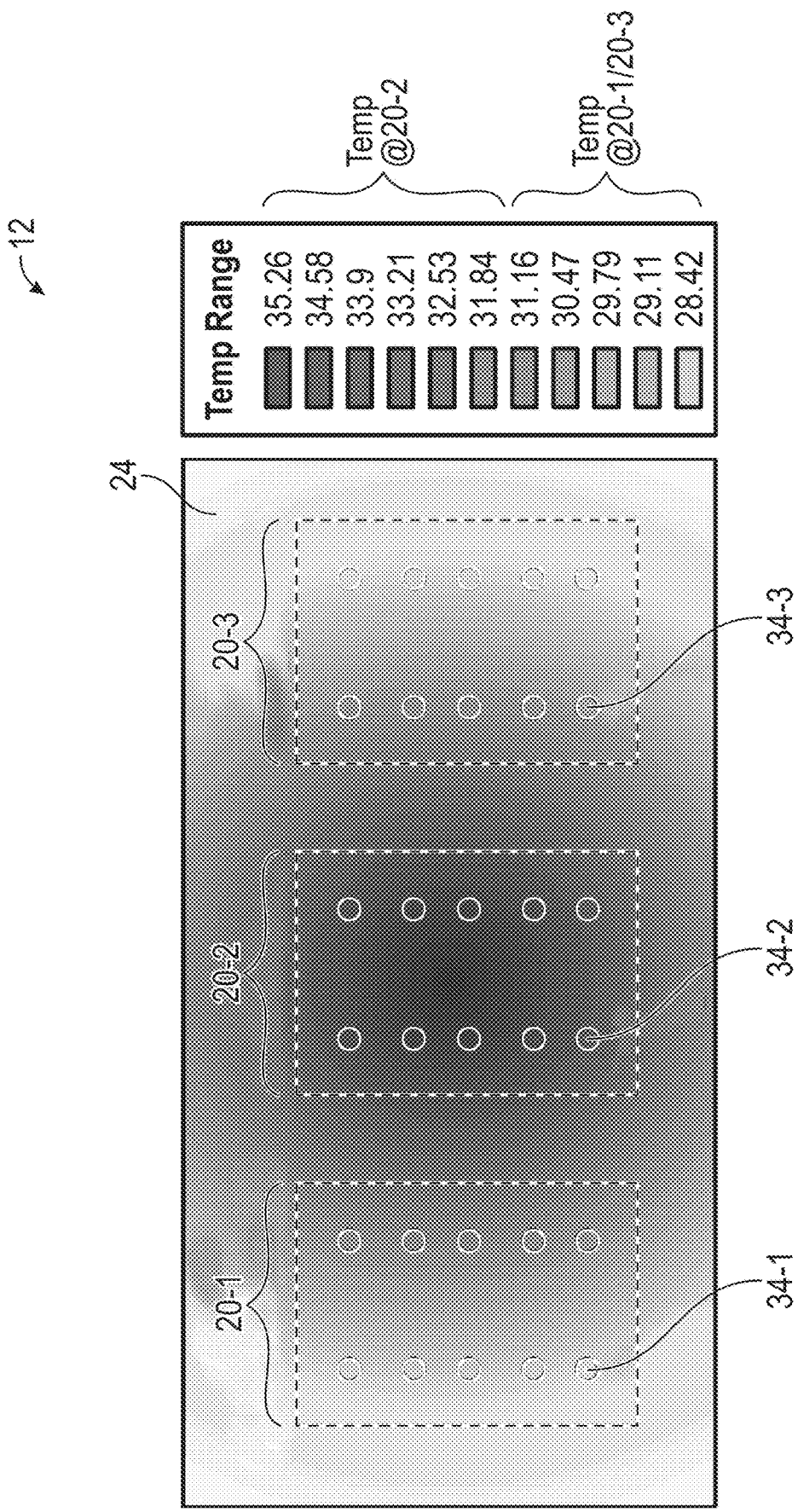
FIG. 2 illustrates a temperature profile of the thermal-enhanced shielded module as shown in FIG. 1A.

In addition, the shielding structure 24 completely covers exposed surfaces within each via hole 34 and is in contact with the non-mold-covered portions of the top surface of each flip-chip die 20. Portions of the shielding structure 24 within each via hole 34 form a number of thru-mold vias 36. In detail, first portions of the shielding structure 24 covering the exposed surfaces within the first via holes 34-1 form first thru-mold vias 36-1, second portions of the shielding structure 24 covering the exposed surfaces within the second via holes 34-2 form second thru-mold vias 36-2, and third portions of the shielding structure 24 covering the exposed surfaces within the third via holes 34-3 form third thru-mold vias 36-3. As such, the first thru-mold vias 36-1 are in contact with the backside of the die substrate 32 of the first flip-chip die 20-1, the second thru-mold vias 36-2 are in contact with the backside of the die substrate 32 of the second flip-chip die 20-2, and the third thru-mold vias 36-3 are in contact with the backside of the die substrate 32 of the third flip-chip die 20-3. The entire shielding structure 24 is continuous and formed in a same plating procedure. For different flip-chip dies 20, a layout of corresponding via holes 34 (corresponding thru-mold vias 36) may be the same or different. For instance, a layout of the first via holes 34-1/the first thru-mold vias 36-1 for the first flip-chip die 20-1, a layout of the second via holes 34-2/the second thru-mold vias 36-2 for the second flip-chip die 20-2, and a layout of the third via holes 34-3/the third thru-mold vias 36-3 for the third flip-chip die 20-3 have a same 2×5 configuration (as illustrated in FIG. 2).

In one embodiment, the shielding structure 24 includes at least a first shielding layer 38 and a second shielding layer 40. The first shielding layer 38 completely covers the top surface and the side surface of the mold compound 22, completely covers the exposed surfaces within each via hole 34, and optionally/partially covers the side surface of the module board 18. The first shielding layer 38 is continuous and may be formed of copper, aluminum, silver, gold, or other conductive materials. The second shielding layer 40 is continuous, resides over the first shielding layer 38, and may be formed of nickel. In order to achieve a superior adhesion, the shielding structure 24 may further include a seed layer 42 formed of copper, aluminum, silver, gold, or other conductive materials. The seed layer 42 is continuous, directly and completely covers the top surface and the side surface of the mold compound 22, completely covers the exposed surfaces within each via hole 34, and optionally/partially covers the side surface of the module board 18, while the first shielding layer 38 is directly over the seed layer 42. It is clear that the entire shielding structure 24 is conductive. Besides providing electromagnetic shielding for the flip-chip dies 20 in the molded module 26 from the external environment, the shielding structure 24, especially the thru-mold vias 36, can further provide thermal dissipation paths for the flip-chip dies 20 in the molded module 26. For different application scales, a thickness of the shielding structure 24, a thickness of the first shielding layer 38, a thickness of the second shielding layer 40, and/or a thickness of the seed layer 42 may vary. In a non-limited example, the thickness of the first shielding layer 38 may be between 3 μm and 16 μm, the thickness of the second shielding layer 40 may be between 1 μm and 3 μm, and the thickness of the seed layer 42 may be between 0.5 μm and 1.5 μm.

The heat flux always flows through the lowest thermal resistance paths. Typically, the heat flux generated by the flip-chip dies 20 can be dissipated by galvanic connection to the carrier board 14, where a first thermal path P1 starts from the device layer 28 of one flip-chip die 20, through the die interconnections 30, through the module board 18 (e.g., connecting/metal layers inside the module board 18), through the module interconnections 16, and towards the carrier board 14.

With the thru-mold vias 36, the heat generated by the flip-chip dies 20 may also be dissipated by die-to-die paths into one or more neighboring components. The shielding structure 24 may need a certain thickness, otherwise, the thermal conductivity of the thru-mold vias 36 might not be high enough to conduct heat flux efficiently (e.g., the thermal conductivity of the thru-mold vias 36 must be higher than the thermal conductivity of the mold compound 22). For a non-limited example, when the second flip-chip die 20-2 is operating (generating heat) and the first and third flip-chip dies 20-1 and 20-3 are not operating (not generating heat), the temperature about the second flip-chip die 20-2 is higher than the temperature about the first and third flip-chip dies 20-1 and 20-3, as illustrated in a temperature profile in FIG. 2. As such the heat generated by the second flip-chip die 20-2 tends to flow from the second flip-chip die 20-2 to the first and third flip-chip dies 20-1 and 20-3. In particular, the heat generated by the second flip-chip die 20-2 may be dissipated by second thermal paths P2, one of which starts from the device layer 28 of the second flip-chip die 20-2, through the die substrate 32 of the second flip-chip die 20-2, through the second thru-mold vias 36-2, through one top portion of the shielding structure 24, through the first thru-mold vias 36-1, through the first flip-chip die 20-1, through the module board 18, through the module interconnections 16, and towards the carrier board 14, while another one of which starts from the device layer 28 of the second flip-chip die 20-2, through the die substrate 32 of the second flip-chip die 20-2, through the second thru-mold vias 36-2, through another top portion of the shielding structure 24, through the third thru-mold vias 36-3, through the third flip-chip die 20-3, through the module board 18, through the module interconnections 16, and towards the carrier board 14. If there are more non-operating dies close to the second flip-chip die 20-2, the heat generated by the second flip-chip die 20-2 may also be dissipated through these non-operating dies utilizing the shielding structure 24/thru-mold vias 36 (not shown).

Furthermore, the heat generated by the second flip-chip die 20-2 may also be dissipated by vertical side walls of the shielding structure 24, where third thermal paths P3 start from the device layer 28 of the second flip-chip die 20-2, through the die substrate 32 of the second flip-chip die 20-2, through the second thru-mold vias 36-2, through portions of the shielding structure 24 across over the first flip-chip die 20-1 and/or across over the third flip-chip die 20-3, through the vertical side walls of the shielding structure 24, through the module board 18, through the module interconnections 16, and towards the carrier board 14.

When the second flip-chip die 20-2 is operating and the first and third flip-chip dies 20-1 and 20-3 are not operating, the first and second thermal paths P1 and P2 may dominate the heat dissipation of the second flip-chip die 20-2. The third thermal paths P3, since the second flip-chip die 20-2 is relatively far away from the vertical side walls of the shielding structure 24 and the relatively thin thickness of the shielding structure 24, are not dominant. However, if three flip-chip dies 20 are working at a same time, the third thermal paths P3 (through the vertical side walls of the shielding structure 24) will take on more heat dissipation, while the second thermal paths P2 may not be dominant. It is because the temperature at the first flip-chip die 20-1/the third flip-chip die 20-3 may be not lower than the temperature at the second flip-chip die 20-2, and the heat may not flow from the second flip-chip die 20-2 to the first flip-chip die 20-1/the third flip-chip die 20-3.

Notice that if the mold compound 22 does not include any via hole 34 but completely encapsulates each flip-chip die 20 and no portion of the shielding structure 24 is in contact with the flip-chip dies 20, the heat generated by the second flip-chip die 20-2 must transmit through the mold compound 22 to reach the shielding structure 24 and the neighboring first and third flip-chip dies 20-1 and 20-3. In consequence, a die area of the second flip-chip die 20-2 (the larger die area the better heat dissipation), a thickness of the mold compound 22 over the second flip-chip die 20-2 (the thinner mold compound the better heat dissipation), and the thermal conductivity of the mold compound 22 (the higher thermal conductivity the better heat dissipation) will significantly affect the heat dissipation of the second flip-chip die 20-2. However, the increased die area of the second flip-chip die 20-2 contradicts the target for a small footprint solution. The decreased thickness of the mold compound 22 is constrained by technological limits for manufacturability. Alternative mold compounds with high thermal conductivities are either not compatible with the utilized compression molding technology or very expensive. Therefore, without the via holes 34/thru-mold vias 36, the heat generated by the second flip-chip die 20-2 cannot be efficiently dissipated through the mold compound 22.

On the other hand, the flip-chip die next to the vertical side walls of the shielding structure 24 (e.g., the first flip-chip die 20-1 or the third flip-chip die 20-3) may also have a vertical thermal path (similar to the first thermal path P1 for the second flip-chip die 20-2), a side-wall thermal path (starting from the device layer 28, through the die substrate 32, through the thru-mold vias 36, through one top portion of the shielding structure 24, through the vertical side walls of the shielding structure 24, through the module board 18, through the module interconnections 16, and towards the carrier board 14), and a die-to-die thermal path (similar to the second thermal path P2 for the second flip-chip die 20-2).

Figure 1B:
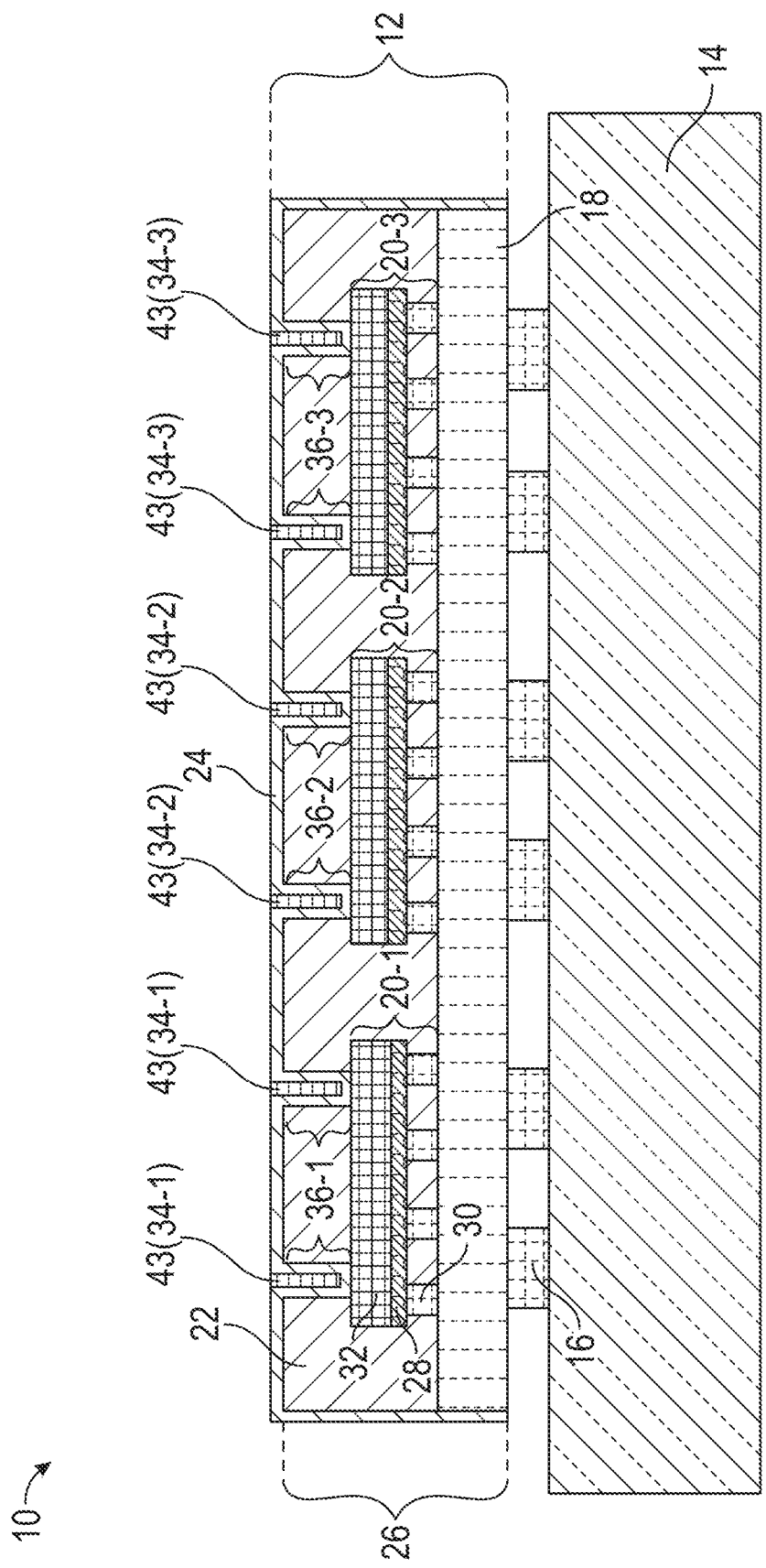

To further reduce the vertical thermal resistance from the flip-chip dies 20 to top portions of the shielding structure 24, a via filler 43 might be used to fill each via hole 34 that remains within a corresponding thru-mold via 36, as illustrated in FIG. 1B. The via filler 43 may be formed of one or more materials with a high thermal conductivity (e.g., >5 W/mK). In addition, the via filler 43 can provide a planarized top surface of the shielded module 12.

Figure 3:
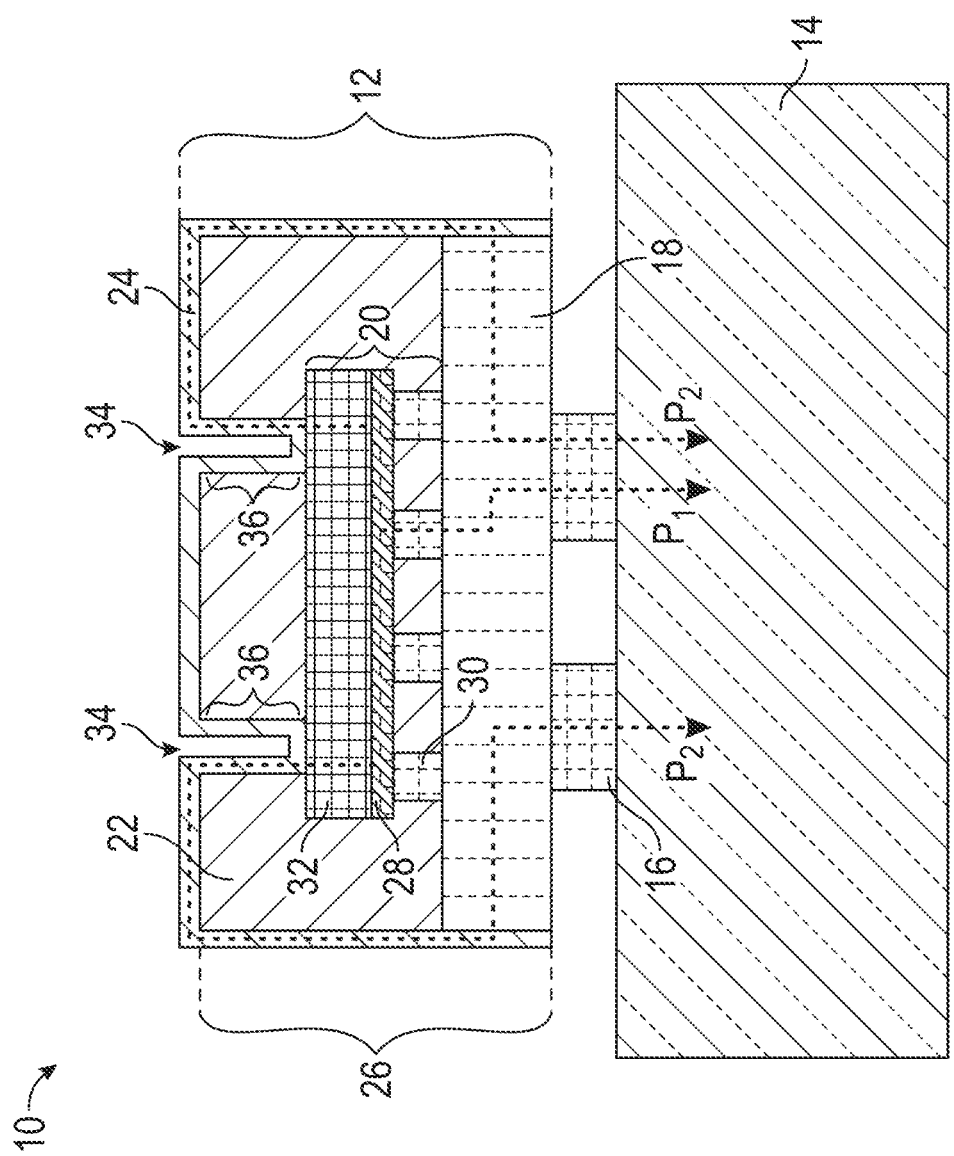
FIGS. 3-4 illustrate the module package with an alternative thermal-enhanced shielded module according to some embodiments of the present disclosure.

In some applications, the shielded module 12/the molded module 26 only includes one flip-chip die 20 instead of multiple flip-chip dies (e.g., the first flip-chip die 20-1, the second flip-chip die 20-2, and the third flip-chip die 20-3), as illustrated in FIG. 3. Herein, the flip-chip die 20 is still formed on the top surface of the module board 18, and includes the device layer 28, the die interconnections 30 underneath the device layer 28, and the die substrate 32 over the device layer 28. The mold compound 22 with the via holes 34 resides over the top surface of the module board 18 and substantially encapsulates the flip-chip die 20. The via holes 34 are vertically above the flip-chip die 20 and extend vertically from the top surface of the mold compound 22 to the top surface of the flip-chip die 20, such that small portions of the backside of the die substrate 32 of the flip-chip die 20 are not covered by the mold compound 22. In this illustration, the shielding structure 24 completely covers the top surface and the side surface of the molded module 26 and does not cover the bottom surface of the molded module 26. In different applications, the shielding structure 24 may only partially (e.g., 90%) cover the side surface of the molded module 26 (e.g., completely cover the side surface of the mold compound 22, but partially or not cover the side surface of the module board 18). In addition, the shielding structure 24 completely covers exposed surfaces within each via hole 34 and is in contact with the non-mold-covered portions of the backside of the die substrate 32 of the flip-chip die 20. Portions of the shielding structure 24 within each via hole 34 form a number of thru-mold vias 36. The entire shielding structure 24 is continuous and formed in a same plating procedure.

In this illustration, since the shielded module 12/the molded module 26 only includes one flip-chip die 20, the heat generated by the flip-chip die 20 cannot be dissipated by the die-to-die paths into neighboring dies. Herein, the heat generated by the flip-chip die 20 can be dissipated by the galvanic connection to the carrier board 14, where a first thermal path P1 starts from the device layer 28 of the flip-chip die 20, through the die interconnections 30, through the module board 18, through the module interconnections 16, and towards the carrier board 14. In addition, with the thru-mold vias 36, the heat generated by the flip-chip die 20 may also be dissipated by the side walls of the shielding structure 24, where a second thermal path P2 starts from the device layer 28, through the die substrate 32, through the thru-mold vias 36, through some top portions of the shielding structure 24, through the vertical side walls of the shielding structure 24, through the module board 18, through the module interconnections 16, and towards the carrier board 14. If the shielded module 12 has a large size, the flip-chip die 20 is relatively far away from the vertical side walls of the shielding structure 24 and the relatively thin thickness of the shielding structure 24, the second thermal path P2 is not dominant.

Figure 4:
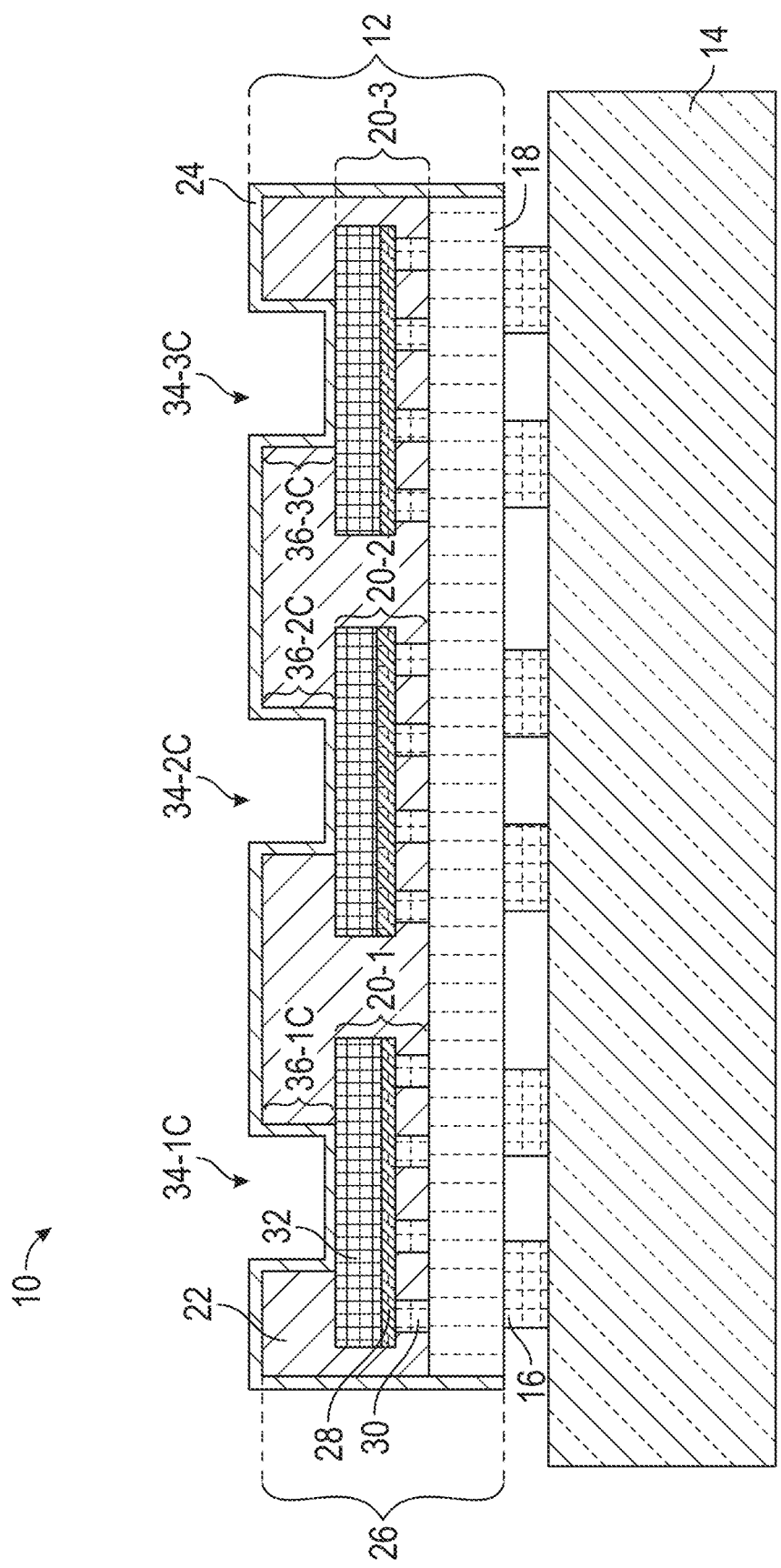

As illustrated in FIGS. 1-3, there are multiple via holes 34/thru-mold vias 36 vertically and directly above each flip-chip die 20. Herein, a minimum diameter/size of one via hole 34 is given by a plating process used to form the shielding structure 24, such that the shielding structure 24 is allowed to get into and deposit inside the via hole 34. In different applications, there might be only one center via hole 34C located over a center of each flip-chip die 20, as illustrated in FIG. 4. Herein, the mold compound 22 includes a number of the center via holes 34C, each of which is vertically above a corresponding flip-chip die 20 and extends vertically from the top surface of the mold compound 22 to the top surface of a corresponding flip-chip die 20. In a non-limited example, a first center via hole 34C-1 extends vertically from the top surface of the mold compound 22 to the top surface of the first flip-chip die 20-1, a second via hole 34C-2 extends vertically from the top surface of the mold compound 22 to the top surface of the second flip-chip die 20-2, and a third center via hole 34C-3 extends vertically from the top surface of the mold compound 22 to the top surface of the third flip-chip die 20-3. As such, a center portion of the backside of the die substrate 32 of each flip-chip die 20 is not covered by the mold compound 22. A maximum diameter/size of one center via hole 34C is ultimately given by a diameter/size of a corresponding flip-chip die 20.

Notice that, in some applications, not every flip-chip die 20 has a corresponding center via hole 34C. In other words, the center via holes 34C may be formed vertically only above certain ones of the flip-chip dies 20 rather than each flip-chip die 20. In a non-limited example, the second center via hole 34C-2 is vertically above the top surface of the (high power/hot) second flip-chip die 20-2 and the third center via hole 34C-3 is vertically above the top surface of the (high power/hot) third flip-chip die 20-3, while the first center via hole 34C-1 is omitted and the first flip-chip die 20-1 is fully encapsulated by the mold compound 22 (not shown).

The mold compound 22 with center via holes 34C still has a top surface vertically beyond the top surface of each flip-chip die 20. The mold compound 22 partially encapsulates the top surface of each flip-chip die 20 (i.e., partially encapsulates the backside of each die substrate 32), fully encapsulates the sides of each flip-chip die 20. In some applications, the mold compound 22 may also fully underfill each flip-chip die 20. In this illustration, the shielding structure 24 completely covers the top surface and the side surface of the molded module 26 and does not cover the bottom surface of the molded module 26. In different applications, the shielding structure 24 may only partially (e.g., 90%) cover the side surface of the molded module 26 (e.g., completely cover the side surface of the mold compound 22, but partially or not cover the side surface of the module board 18). In addition, the shielding structure 24 completely covers exposed surfaces within each center via hole 34C and is in contact with the non-mold-covered portion of the backside of the die substrate 32 of the corresponding flip-chip die 20. Portions of the shielding structure 24 within each center via hole 34C form a center thru-mold via 36C (e.g., a first center thru-mold via 36C-1, a second center thru-mold via 36C-2, and a third center thru-mold via 36C-3, respectively). The entire shielding structure 24 remains continuous and is formed in a same plating procedure.

Typically, compared to one large center via hole 34C/center thru-mold via 36C, multiple small via holes 34/thru-mold vias 36 are preferred for heat dissipation per flip-chip die 20. The multiple thru-mold vias 36 do exhibit more via-sidewalls than a single center thru-mold via 36C, and consequently provide lower vertical thermal resistance paths over the corresponding flip-chip die 20 (through the mold compound 22). For some RF applications, such as RF BAW filters, a large metal coverage of the backside of the flip-chip die 20 may degrade the RF performance. The large center thru-mold via 36C exhibits a large, electrically grounded, contact area on the backside of the corresponding flip-chip die 20, which may cause RF losses, e.g., for BAW filters. Each small thru-mold via 36 has a much smaller contact area with each flip chip die 20 than the large center thru-mold via 36C and will have less impact on the RF performance of the corresponding flip-chip die 20 (a ratio "via-sidewall for thermal conductivity" to "RF grounded contact area" is increased).

FIGS. 5A-5F provide exemplary steps that illustrate a process to manufacture the module package 10 shown in FIG. 1A. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 5A-5F.

Figure 5A:
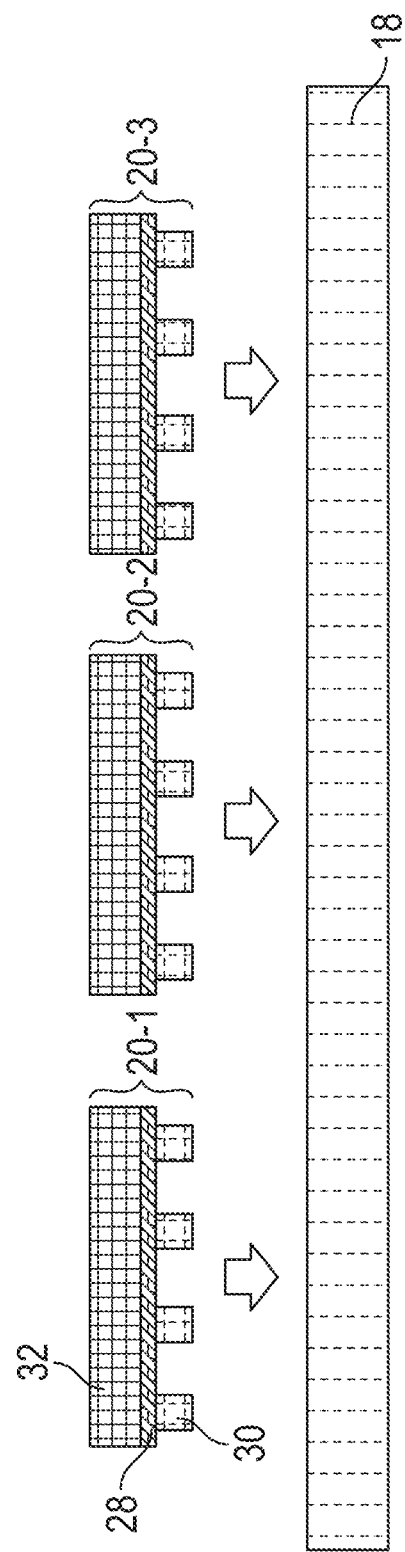
FIGS. 5A-5F illustrate an exemplary manufacturing process to implement the module package shown in FIG. 1A.

Initially, the flip-chip dies 20 (e.g., the first flip-chip die 20-1, the second flip-chip die 20-2, and the third flip-chip die 20-3) are attached to the top surface of the module board 18 as illustrated in FIG. 5A. Herein, the die interconnections 30 of each flip-chip die 20 are coupled to the module board 18 via a conductive adhesive material (not shown). For each flip-chip die 20, the device layer 28 is over the die interconnections 30 and the die substrate 32 is over the device layer 28. As such, the backside of the die substrate 32 is the top surface of a corresponding flip-chip die 20. For the purpose of this illustration, there are three flip-chip dies 20 with a same height attached to the module board 18. In different applications, there might be fewer or more flip-chip dies 20 attached to the module board 18 and each flip-chip die 20 may have a different height.

Figure 5B:
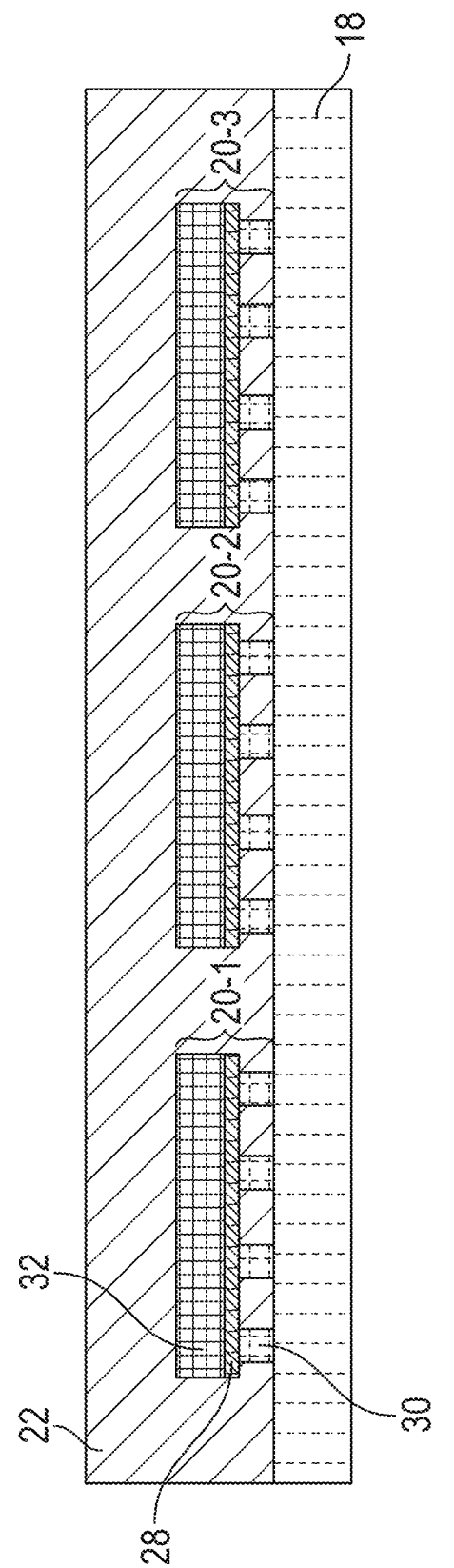

Next, the mold compound 22 is applied over the top surface of the package substrate 14A to form a molded precursor 44, as illustrated in FIG. 5B. The mold compound 22 underfills and fully encapsulates each flip-chip die 20. The mold compound 22 may be applied by various processes, such as sheet molding, overmolding, compression molding, transfer molding, dam fill encapsulation, or screen print encapsulation. A curing process (not shown) is followed to harden the mold compound 22. The curing temperature is between 100° C. and 320° C. depending on which material is used as the mold compound 22. Optionally, the mold compound 22 might be thinned and planarized to achieve a desired height and a flat surface (not shown). The thinning/planarizing procedure may be done with a mechanical grinding process.

Figure 5C:
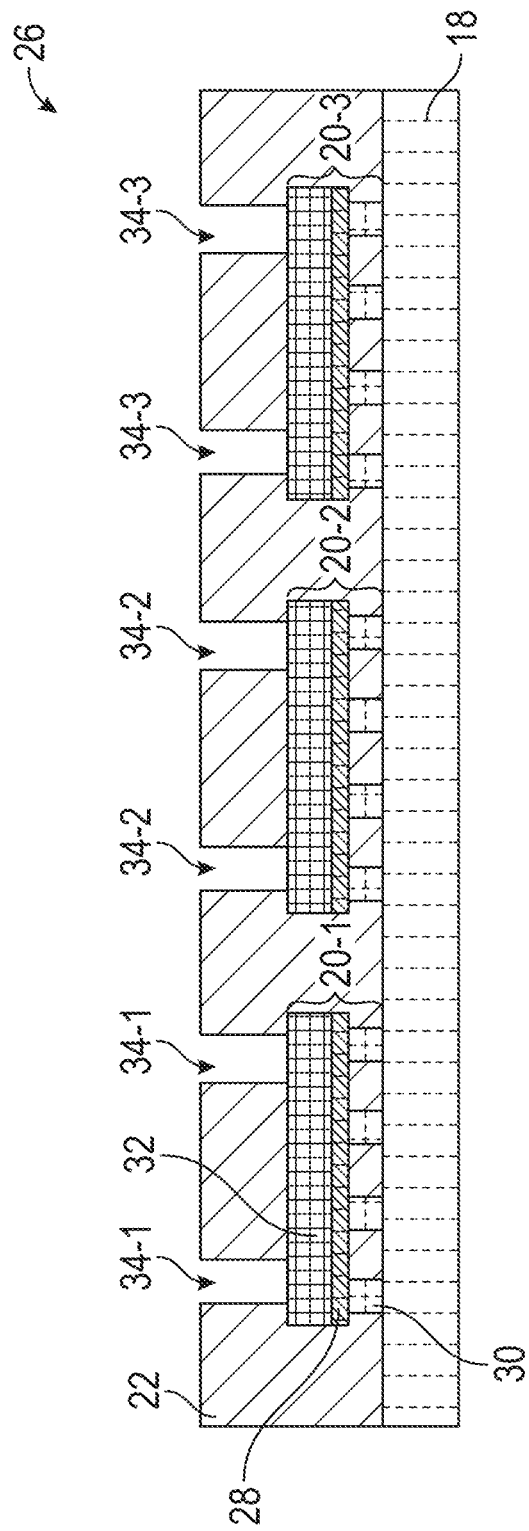

The via holes 34 are then formed within the mold compound 22 to complete the molded module 26, as illustrated in FIG. 5C. Each via hole 34 is formed vertically above a corresponding flip-chip die 20 and extends vertically from the top surface of the mold compound 22 to the top surface of the corresponding flip-chip die 20 (i.e., to the backside of the die substrate 32 of the corresponding flip-chip die 20). As such, portions of the top surface of each flip-chip die 20 (i.e., portions of the backside of the die substrate 32 of each flip-chip die 20) are exposed through corresponding via holes 34. In particular, the first via holes 34-1 extend vertically from the top surface of the mold compound 22 to the top surface of the first flip-chip die 20-1, such that portions of the top surface of the first flip-chip die 20-1 are exposed through the first via holes 34-1. The second via holes 34-2 extend vertically from the top surface of the mold compound 22 to the top surface of the second flip-chip die 20-2, such that portions of the top surface of the second flip-chip die 20-2 are exposed through the second via holes 34-2. The third via holes 34-3 extend vertically from the top surface of the mold compound 22 to the top surface of the third flip-chip die 20-3, such that portions of the top surface of the third flip-chip die 20-3 are exposed through the third via holes 34-3. A cross-section of each via hole 34 might be a circular, square, oval, triangular, rectangular, or any proper shape for forming the shielding structure 24 inside. In addition, each via hole 34 needs to be large enough for plating the shielding structure 24.

For different applications, the flip-chip dies 20 may be a same type or different types of devices. However, regardless of the same or different type, each flip-chip die 20 is required to have a low thermal resistance vertical path (e.g., from the backside of the die substrate 32 to the die interconnections 30) in order to be able to conduct heat flux. In addition, the flip-chip dies 20 may have different heights, such that the via holes 34 over different flip-chip dies 20 will also have different depths. Furthermore, the via holes 34 over different flip-chip dies 20 (e.g., the first via holes 34-1, the second via holes 34-2, and the third via holes 34-3) may be a same or different layout configuration.

The via holes 34 may be formed by a laser drilling or a reactive ion etching process. The laser drilling process works well with the organic mold compound 22 but works ineffectively for the die substrate 32 (e.g., silicon substrate). As such, it can be very easy to stop at the backside of the die substrate 32, and there is no extra stop control/mechanism needed. In some applications, a small portion of the of die substrate 32 might be removed during the process step of forming the via holes 34.

Figure 5D:
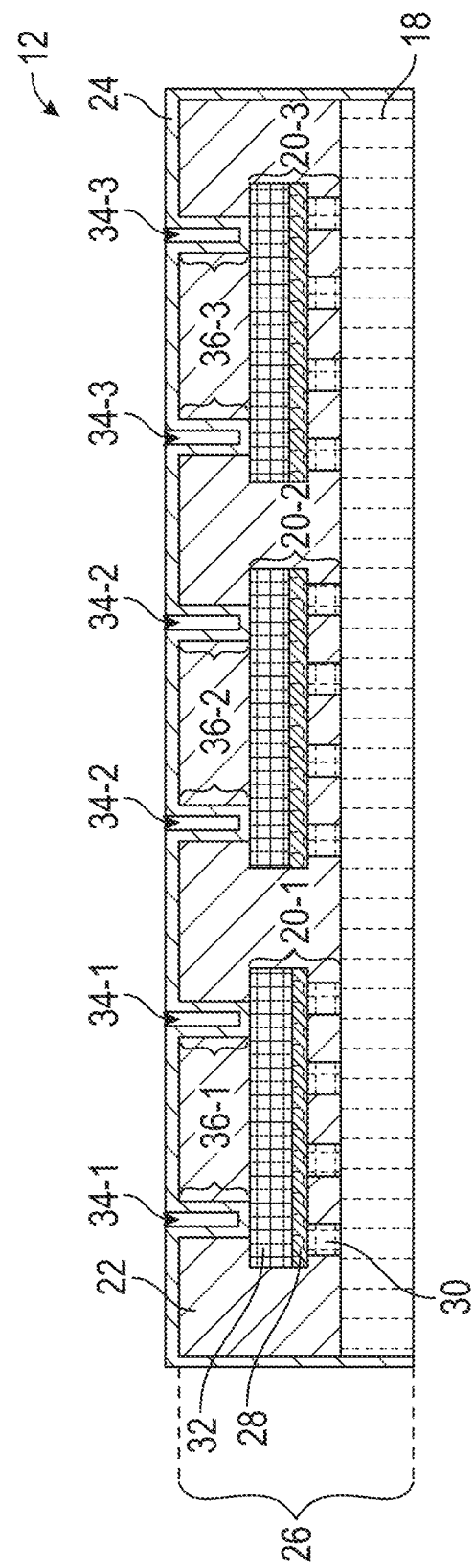

After the molded module 26 is completed, the shielding structure 24 is applied to the molded module 26 to complete the shielded module 12, as illustrated in FIG. 5D. In this illustration, the shielding structure 24 completely covers the top surface and the side surface of the molded module 26 and does not cover the bottom surface of the molded module 26. In different applications, the shielding structure 24 may only partially (e.g., 90%) cover the side surface of the molded module 26 (e.g., completely cover the side surface of the mold compound 22, but partially or not cover the side surface of the module board 18). In addition, the shielding structure 24 completely covers exposed surfaces within each via hole 34 and is in contact with each flip-chip die 20 at the exposed portions of the backside of the die substrate 32. Herein, the first portions of the shielding structure 24 covering the exposed surfaces within the first via holes 34-1 form the first thru-mold vias 36-1 and are in contact with the backside of the die substrate 32 of the first flip-chip die 20-1. The second portions of the shielding structure 24 covering the exposed surfaces within the second via holes 34-2 form second thru-mold vias 36-2 and are in contact with the backside of the die substrate 32 of the second flip-chip die 20-2. The third portions of the shielding structure 24 covering the exposed surfaces within the third via holes 34-3 form third thru-mold vias 36-3 and are in contact with the backside of the die substrate 32 of the third flip-chip die 20-3.

Notice that, the entire shielding structure 24 (including the thru-mold vias 36) is continuous and formed in a same metallization plating procedure. The thru-mold vias 36 do not require additional plating steps. In one embodiment, the shielding structure 24 may include the seed layer 42, the first shielding layer 38, and the second shielding layer 40 (see FIG. 1A). The seed layer 42 may be formed of copper, aluminum, silver, gold, or other conductive materials using a metal deposition, and an electroless and/or electrolytic plating process. The first shielding layer 38 may be formed of copper, aluminum, silver, gold, or other conductive materials using an electrolytic plating process. The second shielding layer 40 may be formed of nickel using an electroless and/or electrolytic plating process. Besides providing electromagnetic shielding for the flip-chip dies 20 in the molded module 26 from the external environment, the shielding structure 24 (especially the thru-mold vias 36) can further provide thermal dissipation paths for the flip-chip dies 20 in the molded module 26. In other words, the shielding structure 24 (especially the thru-mold vias 36) provides low-thermal-resistance paths among the neighboring dies toward the module board 18 and provides low-thermal-resistance paths from the flip-chip dies 20 through the sidewalls of the shielding structure 24 towards the module board 18.

Figure 5E:
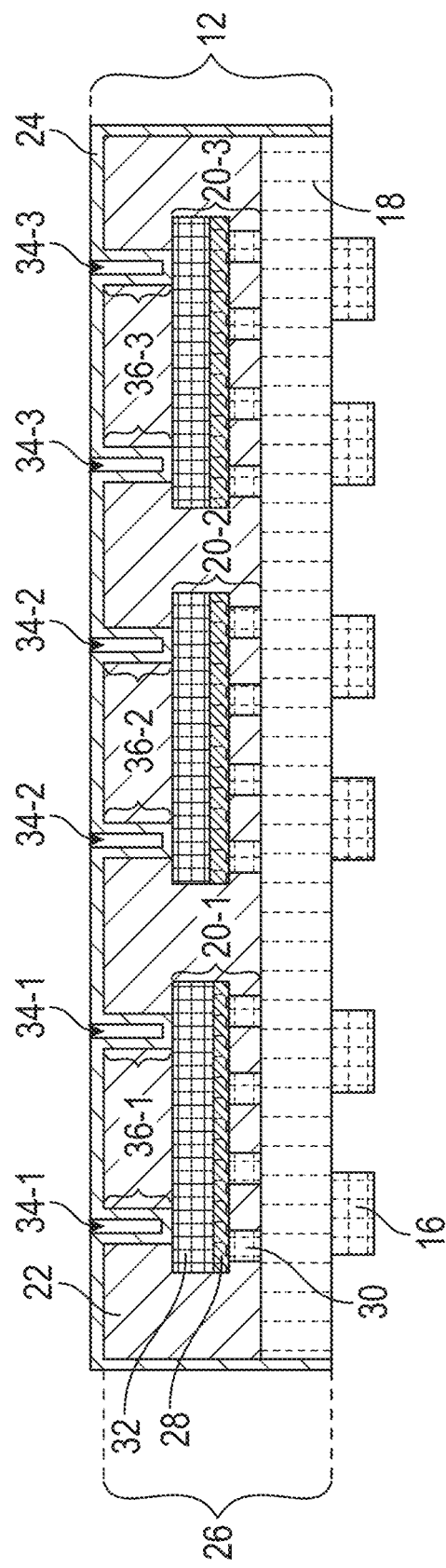
Figure 5F:
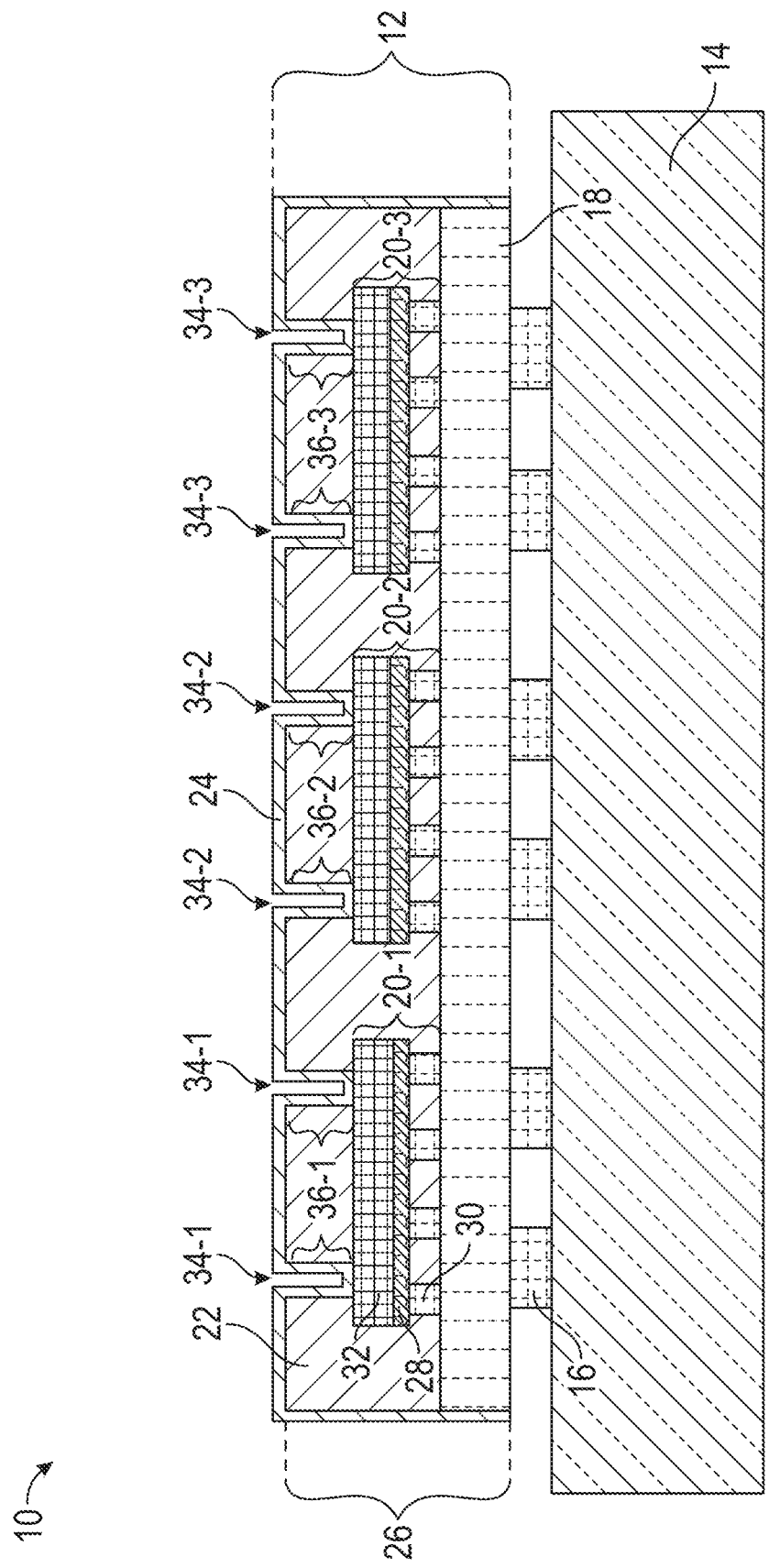

FIG. 5E illustrates that the module interconnections 16 are formed underneath the shielded module 12. Each module interconnection 16 protrudes from the bottom surface of the module board 18. Lastly, the shielded module 12 is attached to the carrier board 14 via the module interconnections 16, as illustrated in FIG. 5F. Herein, each module interconnection 16 is conductive and may be a copper pillar or a solder ball bump. The module board 18 may be a multilayer laminate, which includes conductive connecting layers (not shown) configured to connect among the flip-chip dies 20, to connect between the flip-chip dies 20 and the module interconnection 16, and to ground the shielding structure 24. As such, the heat transmitted to the module board 18 (originally generated by the flip-chip dies 20) is eligible to be sunk into the carrier board 14 through the module board 18 and the module interconnections 16.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
a molded module comprising a module board, a plurality of flip-chip dies, and a mold compound with a plurality of via holes, wherein:
the plurality of flip-chip dies includes a first flip-chip die and a second flip-chip die, each of which is attached to a top surface of the module board;
the mold compound resides over the top surface of the module board to fully encapsulate sides of each of the plurality of flip-chip dies and only partially encapsulate a top surface of the first flip-chip die and a top surface of the second flip-chip die, wherein a top surface of the mold compound is vertically beyond the top surface of the first flip-chip die and the top surface of the second flip-chip die;
at least one first via hole of the plurality of via holes is vertically above the first flip-chip die and extends vertically from the top surface of the mold compound to the top surface of the first flip-chip die, such that at least a portion of the top surface of the first flip-chip die is not covered by the mold compound;
at least one second via hole of the plurality of via holes is vertically above the second flip-chip die and extends vertically from the top surface of the mold compound to the top surface of the second flip-chip die, such that a portion of the top surface of the second flip-chip die is not covered by the mold compound; and
a top surface of the molded module is the top surface of the mold compound, a bottom surface of the molded module is a bottom surface of the module board, and a side surface of the molded module is a combination of a side surface of the mold compound and a side surface of the module board; and
a shielding structure that extends continuously to completely cover surfaces within each of the plurality of via holes, completely cover the top surface of the molded module, and at least partially cover the side surface of the molded module, while not covering the bottom surface of the molded module, wherein:
the shielding structure is conductive and in contact with the top surface of the first flip-chip die and the top surface of the second flip-chip die; and
first portions of the shielding structure within the at least one first via hole form at least one first thru-mold via, and second portions of the shielding structure within the at least one second via hole form at least one second thru-mold via, such that heat generated from the first flip-chip die is capable of dissipating through the second flip-chip die toward the module board via the at least one first thru-mold via and the at least one second thru-mold via.

2. The apparatus of claim 1 wherein:
the at least one first via hole includes a plurality of first via holes distributed over the first flip-chip die;
each of the plurality of first via holes extends vertically from the top surface of the mold compound to the top surface of the first flip-chip die, such that portions of the top surface of the first flip-chip die are not covered by the mold compound; and
the shielding structure completely covers surfaces within each of the plurality of first via holes, such that the shielding structure is in contact with the top surface of the first flip-chip die at a bottom of each of the plurality of first via holes.

3. The apparatus of claim 1 wherein the at least one first via hole is a center via hole which is located over a center of the first flip-chip die.

4. The apparatus of claim 1 wherein:
each of the first flip-chip die and the second flip-chip die includes a device layer, a plurality of die interconnections extending from a bottom surface of the device layer to the top surface of the module board, and a die substrate over a top surface of the device layer, such that a backside of the die substrate is the top surface of the first flip-chip die or the top surface of the second flip-chip die; and
the mold compound fills gaps among the plurality of die interconnections to encapsulate the bottom surface of the device layer and sides of each of the plurality of die interconnections.

5. The apparatus of claim 4 wherein a thermal conductivity of the die substrate is higher than a thermal conductivity of the mold compound.

6. The apparatus of claim 5 wherein the die substrate is formed of silicon.

7. The apparatus of claim 1 further comprising a via filler, wherein the via filler fills the at least one first via hole that remains within the at least one first thru-mold via, and fills the at least one second via hole that remains within the at least one second thru-mold via.

8. The apparatus of claim 1 wherein the shielding structure comprises:
a first layer that extends continuously to completely cover the surfaces within each of the plurality of via holes, completely cover the top surface of the molded module, and at least partially cover the side surface of the molded module, while not covering the bottom surface of the molded module, wherein the first layer is formed of copper, aluminum, silver, or gold; and
a second layer formed over the first layer and formed of nickel.

9. The apparatus of claim 8 wherein the shielding structure has a certain thickness, such that a thermal conductivity of both the at least one first thru-mold via and the at least one second thru-mold via is higher than a thermal conductivity of the mold compound.

10. The apparatus of claim 8 wherein:
the shielding structure further comprises a seed layer, which directly and completely covers the surfaces within each of the plurality of via holes, completely covers the top surface of the molded module, at least partially covers the side surface of the molded module, and does not cover the bottom surface of the molded module, such that the seed layer is in contact with the top surface of the first flip-chip die and the top surface of the second flip-chip die;
the seed layer is formed of copper, aluminum, silver, or gold; and
the first layer is formed over the seed layer.

11. The apparatus of claim 1 wherein the mold compound is formed of an organic epoxy resin system.

12. The apparatus of claim 1 wherein each of the first flip-chip die and the second flip-chip die is a bulk acoustic wave (BAW) filter die.

13. The apparatus of claim 1 wherein multiple ones of the plurality of via holes are vertically above each of the plurality of flip-chip dies.

14. The apparatus of claim 1 wherein only one of the plurality of via holes is vertically above each of the plurality of flip-chip dies.

15. The apparatus of claim 1 wherein the first flip-chip die and the second flip-chip die have different heights, such that the at least one first via hole and the at least one second via hole have different depths.

16. The apparatus of claim 1 wherein the at least one first via hole and the at least one second via hole have different layouts.

17. The apparatus of claim 1 wherein the plurality of flip-chip dies further includes a third flip-chip die, wherein the mold compound fully encapsulates a top surface and sides of the third flip-chip die, and none of the plurality of via holes exist above the third flip-chip die.

18. A method comprising:
providing a molded precursor, which includes a module board, a plurality of flip-chip dies, and a mold compound, wherein:
the plurality of flip-chip dies includes a first flip-chip die and a second flip-chip die, each of which is attached to a top surface of the module board; and
the mold compound resides over the top surface of the module board to fully encapsulate each of the plurality of flip-chip dies;
forming a plurality of via holes within the mold compound to complete a molded module, wherein:
the plurality of via holes includes at least one first via hole and at least one second via hole;
the at least one first via hole is vertically above the first flip-chip die and extends vertically from a top surface of the mold compound to a top surface of the first flip-chip die, such that at least a portion of the top surface of the first flip-chip die is not covered by the mold compound;
the at least one second via hole is vertically above the second flip-chip die and extends vertically from a top surface of the mold compound to a top surface of the second flip-chip die, such that at least a portion of the top surface of the second flip-chip die is not covered by the mold compound; and
a top surface of the molded module is the top surface of the mold compound, a bottom surface of the molded module is a bottom surface of the module board, and a side surface of the molded module is a combination of a side surface of the mold compound and a side surface of the module board; and
forming a shielding structure over the molded module, wherein:
the shielding structure extends continuously to completely cover surfaces within each of the plurality of via holes, completely cover the top surface of the molded module, and at least partially cover the side surface of the molded module, while not covering the bottom surface of the molded module;
the shielding structure is conductive and in contact with the top surface of the first flip-chip die and the top surface of the second flip-chip die; and
first portions of the shielding structure within the at least one first via hole form at least one first thru-mold via, and second portions of the shielding structure within the at least one second via hole form at least one second thru-mold via, such that heat generated from the first flip-chip die is capable of dissipating through the second flip-chip die toward the module board via the at least one first thru-mold via and the at least one second thru-mold via.

* * * * *